United States Patent
Goto et al.

(10) Patent No.: US 11,070,189 B2
(45) Date of Patent: Jul. 20, 2021

(54) JOINT AND ELASTIC WAVE ELEMENT

(71) Applicant: NGK INSULATORS, LTD., Nagoya (JP)

(72) Inventors: Masashi Goto, Nagoya (JP); Yudai Uno, Nagoya (JP); Tomoyoshi Tai, Inazawa (JP)

(73) Assignee: NGK INSULATORS, LTD., Nagoya (JP)

(*) Notice: Subject to any disclaimer, the term of this patent is extended or adjusted under 35 U.S.C. 154(b) by 0 days.

(21) Appl. No.: 17/034,828

(22) Filed: Sep. 28, 2020

(65) Prior Publication Data

US 2021/0013864 A1 Jan. 14, 2021

Related U.S. Application Data

(63) Continuation of application No. PCT/JP2019/010572, filed on Mar. 14, 2019.

(30) Foreign Application Priority Data

Mar. 29, 2018 (JP) .............................. JP2018-063941

(51) Int. Cl.
*H03H 9/02* (2006.01)
*H03H 9/25* (2006.01)

(52) U.S. Cl.
CPC .... *H03H 9/02574* (2013.01); *H03H 9/02559* (2013.01); *H03H 9/25* (2013.01)

(58) Field of Classification Search
CPC ........... H03H 9/02535; H03H 9/02559; H03H 9/02574

(Continued)

(56) References Cited

U.S. PATENT DOCUMENTS 7,213,314 B2    5/2007  Abbott et al.
10,284,169 B2*  5/2019  Goto ..................... H03H 3/08
                        (Continued)

FOREIGN PATENT DOCUMENTS

JP      3774782 B2    12/2004
JP      2010187373 A   8/2010
                (Continued)

OTHER PUBLICATIONS

International Search Report with English translation issued in corresponding International Application No. PCT/JP2019/010572, dated May 28, 2019 (5 pages).

(Continued)

*Primary Examiner* — Derek J Rosenau
(74) *Attorney, Agent, or Firm* — Flynn Thiel, P.C.

(57) ABSTRACT

A bonded body includes a supporting substrate, a piezoelectric single crystal substrate and a bonding layer provided between the supporting substrate and piezoelectric single crystal substrate. The bonding layer has a composition of $Si_{(1-x)}O_x$ (x represents an oxygen ratio). The oxygen ratio x at a central part in a thickness direction of the bonding layer is higher than an oxygen ratio x at an end part of the bonding layer on a side of the piezoelectric single crystal substrate and an oxygen ratio x at an end part of the bonding layer on a side of the supporting substrate. The oxygen ratio at the central part in the thickness direction of the bonding layer is 0.013 or higher and 0.666 or lower.

6 Claims, 6 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2004/0226162 A1 | 11/2004 | Miura et al. |
| 2010/0182101 A1 | 7/2010 | Suzuki |
| 2014/0009036 A1 | 1/2014 | Iwamoto |
| 2015/0155299 A1 | 6/2015 | Kitada |
| 2018/0294793 A1 | 10/2018 | Tanno et al. |
| 2019/0280666 A1 | 9/2019 | Akiyama et al. |

FOREIGN PATENT DOCUMENTS

| | | |
|---|---|---|
| JP | 3184763 U | 7/2013 |
| JP | 201486400 A | 5/2014 |
| WO | 2012124648 A1 | 9/2012 |
| WO | 2013129572 A1 | 9/2013 |
| WO | 2017051747 A1 | 3/2017 |
| WO | 2018016169 A1 | 1/2018 |

OTHER PUBLICATIONS

Written Opinion of International Searching Authority issued in corresponding International Application No. PCT/JP2019/010572, dated May 28, 2019 (3 pages).
English Translation of the International Preliminary Report on Patentability, issued in corresponding International Application No. PCT/JP2019/010572, dated Oct. 8, 2020 (6 pages).

* cited by examiner

JOINT AND ELASTIC WAVE ELEMENT

CROSS-REFERENCE TO RELATED APPLICATIONS

This is a continuation of PCT/JP2019/010572, filed Mar. 14, 2019, which claims priority to Japanese Application No. JP2018-063941, filed Mar. 29, 2018, the entire contents of which are hereby incorporated by reference.

TECHNICAL FIELD

The present invention relates to a bonded body of a piezoelectric single crystal substrate and a supporting substrate, and an acoustic wave device including the same.

BACKGROUND ARTS

A surface acoustic wave device functioning as a filter device or oscillator used in mobile phones or the like and an acoustic wave device, such as lamb wave device or film bulk acoustic resonator (FBAR) using a piezoelectric thin film, is known. As such an acoustic wave device, a device produced by adhering a supporting body and a piezoelectric substrate propagating a surface acoustic wave, and by providing interdigitated electrodes capable of oscillating the surface acoustic wave on a surface of the piezoelectric substrate, is known. By adhering the supporting body whose thermal expansion coefficient is lower than that of the piezoelectric substrate, onto the piezoelectric substrate, the change of a size of the piezoelectric substrate in response to temperature change is reduced so that the change of the frequency characteristics of the surface acoustic wave device is reduced.

In Patent document 1, a surface acoustic wave device having the structure produced by adhering a piezoelectric single crystal substrate and silicon substrate with an adhesive layer composed of an epoxy adhering agent is proposed.

Here, it is known that, in bonding a piezoelectric substrate and a silicon substrate, a silicon oxide film is formed on a surface of the piezoelectric substrate, and the silicon substrate and the piezoelectric substrate are bonded through the silicon oxide film. In the bonding, a plasma beam is irradiated onto the surfaces of the silicon oxide film and silicon substrate to activate the surfaces, followed by the direct boding (Patent document 2).

Further, a direct bonding method of a so-called FAB (Fast Atom Beam) system is known. According to this method, a neutralized atomic beam is irradiated onto the respective bonding surfaces at an ambient temperature and the direct bonding is performed (Patent document 3).

A piezoelectric single crystal substrate that is directly bonded to a supporting substrate composed of a ceramic material (alumina, aluminum nitride, silicon nitride) through an intermediate layer, not to a silicon substrate, is described in Patent document 4. It is described that the material of the intermediate layer is made of silicon, a silicon oxide, a silicon nitride, or aluminum nitride.

Further, when a piezoelectric substrate and a supporting substrate are bonded with an organic adhesive, Rt (maximum height of the profile of a roughness curve) of an adhesive surface of the supporting substrate to the piezoelectric substrate is made 5 nm or larger and 50 nm or smaller to obtain the effect of preventing fracture by stress relaxation (Patent document 5).

RELATED DOCUMENTS

Patent Documents (Patent document 1) Japanese Patent Publication No. 2010-187373A
(Patent document 2) U.S. Pat. No. 7,213,314 B2
(Patent document 3) Japanese Patent Publication No. 2014-086400A
(Patent document 4) Japanese Patent Publication No. 3774782B
(Patent document 5) Japanese Utility model Registration No. 3184763U

SUMMARY OF THE INVENTION

However, depending on the application of the bonded body, it is desired to improve the insulating property by raising the electric resistance of the bonding layer. For example, in the case of an acoustic wave device, noise or loss can be reduced by improving the insulating property of the bonding layer. However, it is difficult to bond the supporting substrate to the piezoelectric single crystal substrate through the high resistance bonding layer at a high strength, resulting in peeling that tends to occur between the piezoelectric single crystal substrate and supporting substrate during a subsequent processing step and the Q value of the acoustic wave device that tends to decrease.

An object of the present invention is, in a bonded body including a supporting substrate composed of a polycrystalline ceramic material or monocrystalline material, a piezoelectric single crystal substrate and a bonding layer provided between the supporting substrate and piezoelectric single crystal substrate, to improve the bonding strength of the supporting substrate and piezoelectric single crystal substrate and to improve the Q value.

The present invention provides a bonded body comprising:
a supporting substrate comprising a polycrystalline ceramic material or a monocrystalline material;
a piezoelectric single crystal substrate; and
a bonding layer provided between the supporting substrate and the piezoelectric single crystal substrate,
wherein the bonding layer has a composition of $Si_{(1-x)}O_x$ (x indicates an oxygen ratio),
wherein the oxygen ratio x at a central part in a thickness direction of said bonding layer is higher than the oxygen ratio x at an end part of the bonding layer on a side of the piezoelectric single crystal substrate and the oxygen ratio x at an end part of the bonding layer on a side of the supporting substrate, and
wherein the oxygen ratio x at the central part in the thickness direction of the bonding layer is 0.013 or higher and 0.666 or lower.

The present invention further provides an acoustic wave device comprising:
the bonded body; and
an electrode provided on the piezoelectric single crystal substrate.

According to the present invention, in the bonded body including the supporting substrate composed of the polycrystalline ceramic material or monocrystalline material, piezoelectric single crystal substrate and bonding layer between the supporting substrate and piezoelectric single crystal substrate, it is possible to raise the insulating property of the bonding layer and improve the bonding strength of the supporting substrate and piezoelectric single crystal substrate. It is thereby possible to provide an acoustic wave device having a high bonding strength and a low loss (high Q value).

EMBODIMENTS FOR CARRYING OUT THE INVENTION

The present invention will be described further in detail below, appropriately referring to drawings.

FIGS. 1 and 2 relate to an embodiment, in which a bonding layer 2 is provided on a piezoelectric single crystal substrate 4 and directly bonded to a surface 1a of a supporting substrate 1.

Figure 1A:
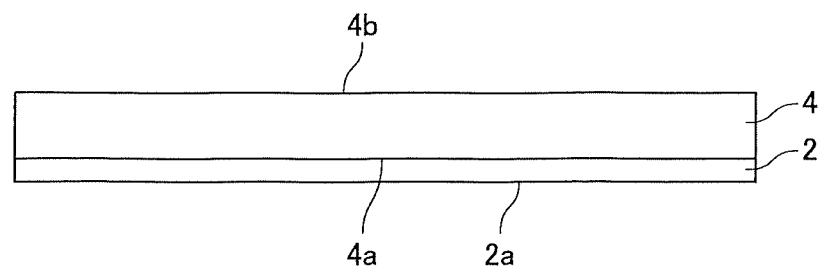
FIG. 1(a) shows the state where a bonding layer 2 is provided on a piezoelectric single crystal substrate 4.

As shown in FIG. 1(a), the bonding layer 2 is provided on a surface 4a of the piezoelectric single crystal substrate 4. 4b represents a surface on the opposite side. At this time, unevenness may be present on the surface 2a of the bonding layer 2.

Figure 1B:
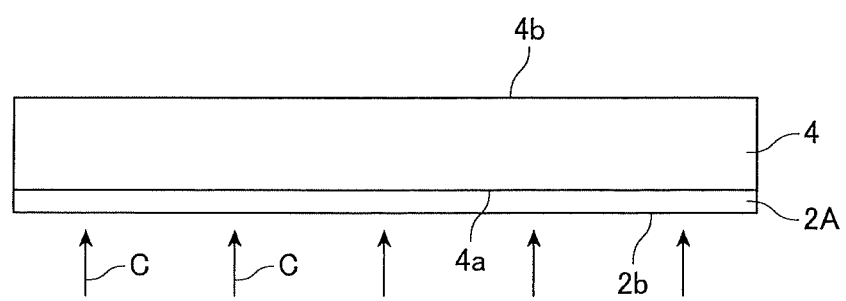
FIG. 1(b) shows the state where a surface 2b of a bonding layer 2A is activated by neutralized beam C.

Then, according to a preferred embodiment, the surface 2a of the bonding layer 2 is subjected to a flattening process to form a flat surface 2b of the bonding layer 2, as shown in FIG. 1(b). By means of this flattening process, the thickness of the bonding layer 2 is normally made smaller to provide a thinner bonding layer 2A (refer to FIG. 1(b)). However, the flattening process is not necessarily performed. Then, a neutralized beam is irradiated onto the surface 2b of the bonding layer 2A, as indicated by arrows A, to activate the surface 2b of the bonding layer 2A to provide an activated surface.

Figure 1C:
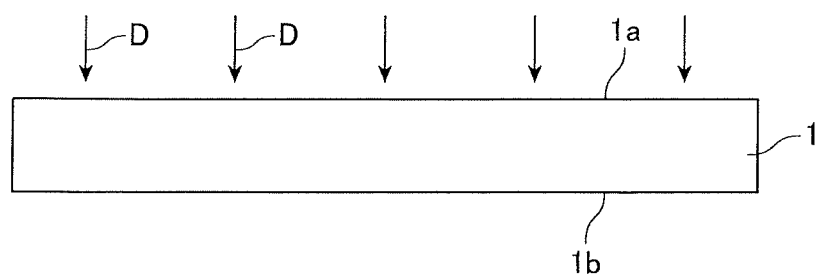
FIG. 1(c) shows the state where a surface 1a of a supporting substrate 1 is activated by neutralized beam D.
Figure 2A:
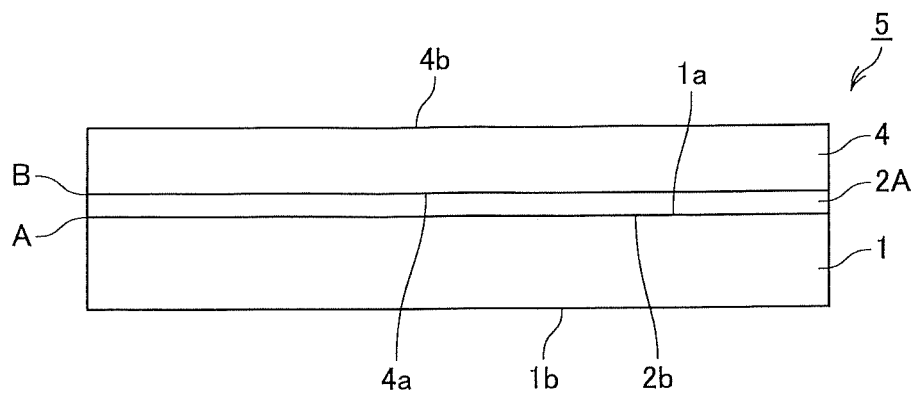
FIG. 2(a) shows the state where the supporting substrate 1 is directly bonded with the bonding layer 2A.

Further, as shown in FIG. 1(c), a neutralized beam is irradiated onto the surface 1a of the supporting substrate 1 as indicated by arrows D. Then, as shown in FIG. 2(a), the activated surface 1a of the supporting substrate 1 and activated surface 2b of the bonding layer 2A are directly bonded with each other to obtain a bonded body 5.

Figure 2B:
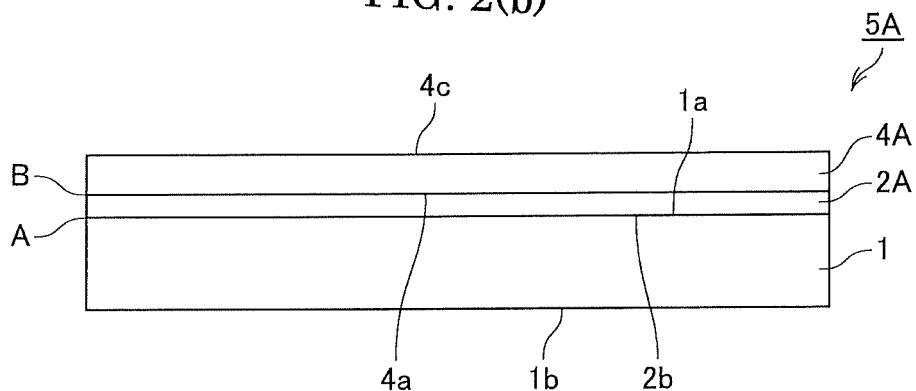
FIG. 2(b) shows the state where a piezoelectric single crystal substrate 4A is thinned by processing.

According to a preferred embodiment, the surface 4b of the piezoelectric single crystal substrate 4 of the bonded body 5 is further subjected to polishing to make the thickness of the piezoelectric single crystal substrate 4A smaller as shown in FIG. 2(b), to obtain a bonded body 5A. 4c represents a polished surface.

Figure 2C:
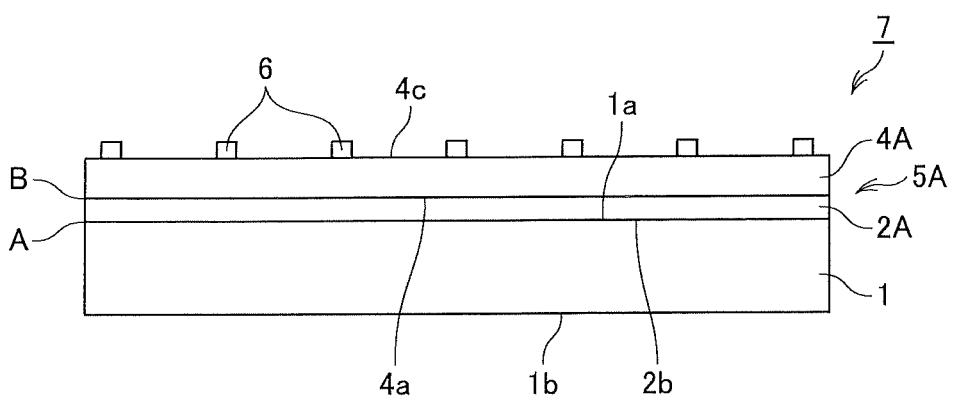
FIG. 2(c) shows the state where an electrode 6 is provided on the piezoelectric single crystal substrate 4A.

As shown in FIG. 2(c), predetermined electrodes 6 are formed on the polished surface 4c of the piezoelectric single crystal substrate 4A to produce an acoustic wave device 7.

Figure 3:
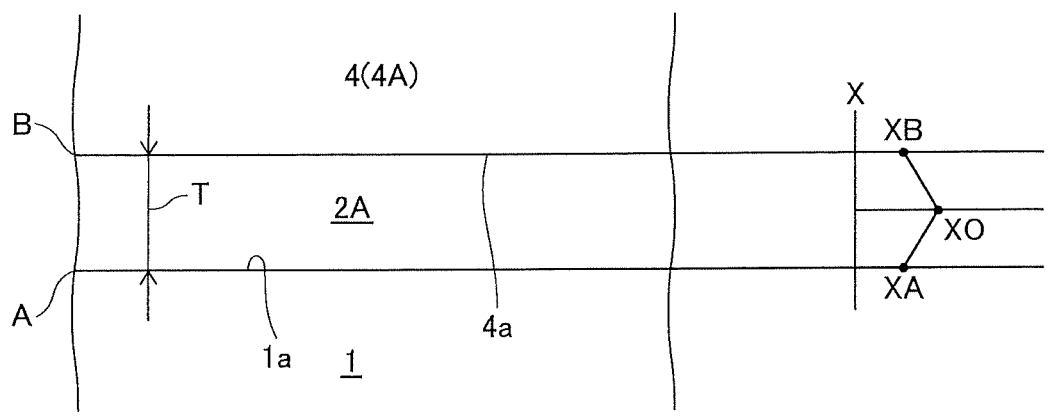
FIG. 3 is a conceptual diagram showing the oxygen ratio in the bonding layer 2A.

According to the present invention, the bonding layer 2A has a composition of $Si_{(1-x)}O_x$ (x represents an oxygen ratio). Then, as shown in FIG. 3, the oxygen ratio xO at a central part in the thickness direction of the bonding layer 2A is higher that the oxygen ratio xB at the end part (vicinity of an interface B) of the bonding layer 2A on the side of the piezoelectric single crystal substrate 4 (4A) and the oxygen ratio xA at the end part (vicinity of an interface A) of the bonding layer 2A on the side of the supporting substrate 1. Further, the oxygen ratio xO at the central part in the thickness direction of the bonding layer 2A is made 0.013 or higher and 0.666 or lower. As a result, it is possible to provide an acoustic wave device 7 having a high bonding strength and high Q value.

According to the present invention, the maximum value of the oxygen ratio x in the bonding layer 2A is 0.013 or higher and 0.666 or lower. Thereby, it is possible to considerably improve the Q value and to improve the bonding strength of the piezoelectric single crystal substrate 4(4A) onto the supporting substrate 1. From this viewpoint, the maximum value of the oxygen ratio x in the bonding layer 2A may preferably be 0.05 or higher.

Figure 5A:
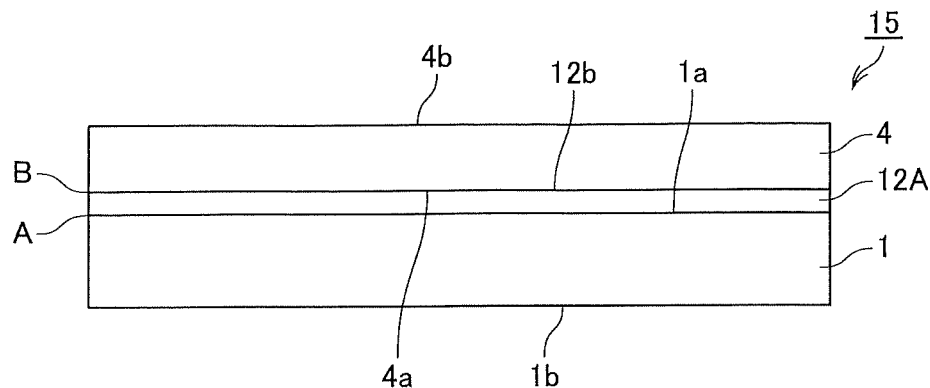
FIG. 5(a) shows the state where the piezoelectric single crystal substrate 4 is directly bonded with the bonding layer 12A.
Figure 5B:
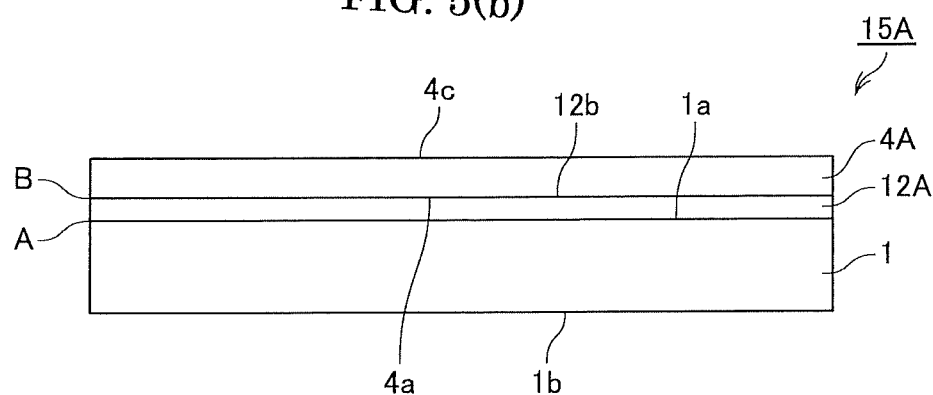
FIG. 5(b) shows the state where the piezoelectric single crystal substrate 4A is thinned by processing.
Figure 5C:
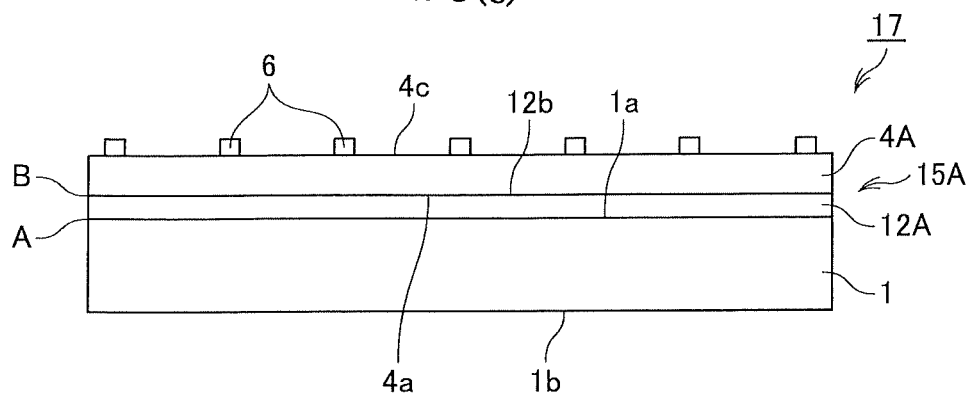
FIG. 5(c) shows the state where an electrode 6 is provided on the piezoelectric single crystal substrate 4A.
Figure 6:
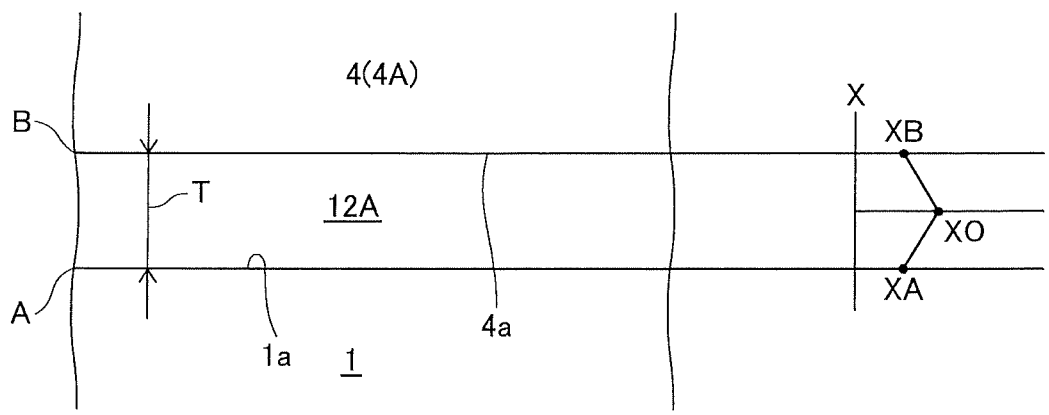
FIG. 6 is a conceptual diagram showing the oxygen ratio in the bonding layer 12A.

According to an embodiment shown in FIGS. 4 to 6, a bonding layer 12A is formed on a supporting substrate 1, and the bonding layer 12A is bonded to a piezoelectric single crystal substrate 4.

Figure 4A:
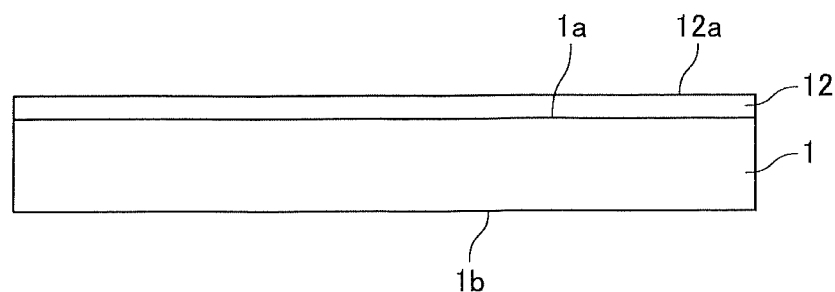
FIG. 4(a) shows the state where a bonding layer is provided on the supporting substrate 1.

That is, as shown in FIG. 4(a), a bonding layer 12 is provided on the surface 1a of the supporting substrate 1. At this time, unevenness may be present on a surface 12a of the bonding layer 12.

Figure 4B:
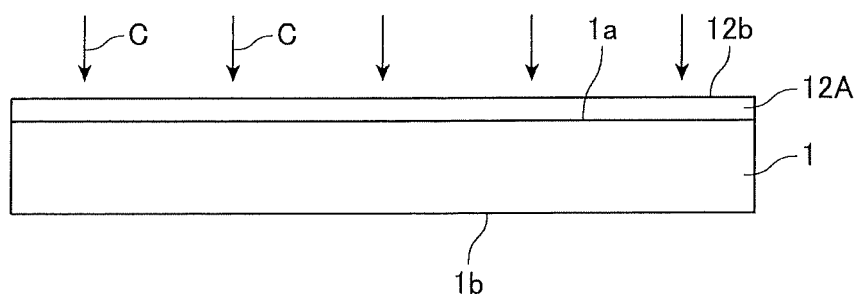
FIG. 4(b) shows the state where a surface 12b of a bonding layer 12A is activated by a neutralized beam C.

Then, according to a preferred embodiment, the surface 12a of the bonding layer 12 is subjected to a flattening process to form a flat surface 12b of the bonding layer 12A, as shown in FIG. 4(b). By means of this flattening process, the thickness of the bonding layer 12 is normally made smaller to provide a thinner bonding layer 12A (refer to FIG. 4(b)). However, the flattening process is not necessarily performed. Then, a neutralized beam is irradiated onto the surface 12b of the bonding layer 12A, as indicated by arrows C, to activate the surface of the bonding layer 12A to provide an activated surface.

Figure 4C:
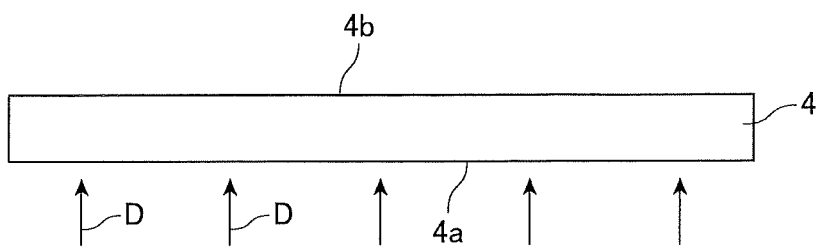
FIG. 4(c) shows the state where a surface 4a of the piezoelectric single crystal substrate 4 is activated by a neutralized beam D.

Further, as shown in FIG. 4(c), a neutralized beam D is irradiated onto a surface of a piezoelectric single crystal substrate 4 to activate the surface to provide an activated surface 4a. Then, as shown in FIG. 5(a), the activated surface 12b of the bonding layer 12A and the surface 4a of the piezoelectric single crystal substrate 4 are directly bonded with each other to obtain a bonded body 15 (refer to FIG. 5(a)). Thereafter, as shown in FIGS. 5(b) and 5(c), the surface 4b of the piezoelectric single crystal substrate 4 of the bonded body 15 is further subjected to polishing to obtain a bonded body 15A, and predetermined electrodes 6 are formed on the polished surface 4c of the piezoelectric single crystal substrate 4A to produce an acoustic wave device 17.

According to a preferred embodiment, as shown in a schematic diagram shown in FIG. 6, the oxygen ratio xO at the central part in the thickness direction of the bonding layer 12A is higher than the oxygen ratio xB at the end part of the bonding layer 12A on the side of the piezoelectric single crystal substrate 4(4A) and the oxygen ratio xA at the end part of the bonding layer 12A on the side of the supporting substrate 1. Further, the oxygen ratio xO at the central part in the thickness direction of the bonding layer 12A is made 0.013 or higher and 0.666 or lower. Thereby, it is possible to provide an acoustic wave device 17 having a high bonding strength and high Q value.

According to a preferred embodiment, the interface A between the supporting substrate 1 and bonding layer 2A is the interface formed by direct bonding. FIGS. 1 to 3 relate to this embodiment. Then, according to the present embodiment, the oxygen ratio xA at the end part of the bonding layer 2A on the side of the supporting substrate 1 is 0.001 or higher and 0.408 or lower. Thereby, it is possible to further improve the bonding strength and to maintain the Q value at a high value. From this viewpoint, the oxygen ratio xA at the end part of the bonding layer 2A on the side of the supporting substrate 1 may preferably be 0.005 or higher, or 0.3 or lower.

Further, according to a preferred embodiment, the interface B between the piezoelectric single crystal substrate 4(4A) and bonding layer 12A is the interface formed by the direct bonding. FIGS. 4 to 6 relate to this embodiment. Then, according to the present embodiment, the oxygen ratio xB at the end part (vicinity of interface B) of the bonding layer 12A on the side of the piezoelectric single crystal substrate 12A is 0.001 or higher and 0.408 or lower. Thereby, it is possible to further improve the bonding strength and to maintain the Q value at a high value. From this viewpoint, the oxygen ratio xB at the end part of the bonding layer 12A on the side of the piezoelectric single crystal substrate 4 (4A) may preferably be 0.005 or higher, or 0.3 or lower.

Further, according to a preferred embodiment, both of the oxygen ratio xB at the end part of the bonding layer 2A or 12A on the side of the piezoelectric single crystal substrate 4 (4A) and the oxygen ratio xA at the end part of the bonding layer 2A or 12A on the side of the supporting substrate 1 are 0.001 or higher and 0.408 or lower. Thereby, it is possible to further improve the bonding strength and to maintain the Q value at a high value. From this viewpoint, both of the oxygen ratio xB at the end part of the bonding layer 2 or 2A on the side of the piezoelectric single crystal substrate 4 (4A) and the oxygen ratio xA at the end part of the bonding layer 2A or 12A on the side of the supporting substrate 1 may preferably be 0.005 or higher, or 0.3 or lower.

Further, the oxygen ratio xB at the end part of the bonding layer 2A or 12A on the side of the piezoelectric single crystal substrate 2A or 12A, the oxygen ratio xA at the end part of the bonding layer 2A or 12A on the side of the supporting substrate 1, and the oxygen ratio xO at the central part in the thickness direction of the bonding layer 2A or 12A are to be measured as described in the Example section.

Respective constituents of the present invention will be described further in detail below.

According to the present invention, the supporting substrate 1 is composed of a polycrystalline ceramic material or a monocrystalline material. The monocrystalline material forming the supporting substrate 1 may preferably be silicon and sapphire. Further, the polycrystalline ceramic material may preferably be a material selected from the group consisting of mullite, cordierite, translucent alumina and sialon.

Specifically, as the materials of the piezoelectric single crystal 4 and 4A, single crystals of lithium tantalate (LT), lithium niobate (LN), lithium niobate-lithium tantalate solid solution, quartz and lithium borate may be listed. Among them, LT or LN is more preferred. As LT or LN has a high propagation speed of a surface acoustic wave and a large electro-mechanical coupling factor, it is preferred for use in a piezoelectric surface acoustic wave device for high frequency and wide-band frequency applications. Further, the normal direction of the main surface of the piezoelectric single crystal substrate 4 or 4A is not particularly limited. However, when the piezoelectric single crystal substrate 4 or 4A is made of LT, for example, it is preferred to use the substrate rotated from Y-axis to Z-axis by 36 to 47° (for example 42°) with respect to X-axis, which is a direction of propagation of a surface acoustic wave, because of a low propagation loss. When the piezoelectric single crystal substrate 4 is made of LN, it is preferred to use the substrate rotated from Y-axis to Z-axis by 60 to 68° (for example 64°) with respect to X-axis, which is a direction of propagation of a surface acoustic wave, because of a lower propagation loss. Further, although the size of the piezoelectric single crystal substrate 4 or 4A is not particularly limited, for example, the diameter may be 50 to 150 mm and thickness may be 0.2 to 60 µm.

The electrical resistivity of the bonding layer 2, 2A, 12 or 12A may preferably be $4.8 \times 10^3$ Ω·cm or higher, more preferably be $5.8 \times 10^3$ Ω·cm or higher, and particularly preferably be $6.2 \times 10^3$ Ω·cm or higher. Further, the electrical resistivity of the bonding layer 2, 2A, 12 or 12A is generally $1.0 \times 10^8$ Ω·cm or lower.

Although the thickness T of the bonding layer 2, 2A, 12 or 12A is not particularly limited, it may preferably be 0.01 to 10 µm and more preferably be 0.05 to 0.5 µm, from the viewpoint of production cost.

Although the film-forming method of the bonding layer 2, 2A, 12 or 12A is not particularly limited, sputtering, chemical vapor deposition (CVD), and vapor deposition may be listed. Here, particularly preferably, during reactive sputtering using a sputtering target of Si, the amount of oxygen gas that flows into a chamber is adjusted so that the oxygen ratios (x) in the bonding layer 2, 2A, 12 or 12A can be controlled. That is, during the film formation of a single bonding layer 2, 2A, 12 or 12A, the amount of the oxygen gas may be increased to raise the oxygen ratio x and may be decreased to lower the oxygen ratio x.

Although specific conditions for manufacturing the bonding layer 2, 2A, 12 or 12A is appropriately selected depending on the specification of the chamber, according to a preferred example, the total pressure is made 0.28 to 0.34 Pa, the partial pressure of oxygen is made $1.2 \times 10^{-3}$ to $5.7 \times 10^{-2}$ Pa, and the film-forming temperature is set to ambient temperature. Further, Si doped with B is exemplified as the Si target.

According to a preferred embodiment, the surface 12b of the bonding layer 12 or 12A and the surface 4a of the piezoelectric single crystal substrate 4 are directly bonded with each other, or the surface 2b of the bonding layer 2 or 2A and the surface 1a of the supporting substrate 1 are directly bonded with each other. In this case, the arithmetic average roughness Ra of the surface 2b or 12b of the bonding layer 2, 2A, 12 or 12A may preferably be 1 nm or smaller and more preferably be 0.3 nm or smaller. Further, the arithmetic average roughness Ra of the surface 4a of the piezoelectric single crystal substrate 4 or the surface 1a of the supporting substrate 1 may preferably be 1 nm or smaller and more preferably be 0.3 nm or smaller. As a result, the bonding strength of the piezoelectric single crystal substrate 4 or supporting substrate 1 and bonding layer 2, 2A, 12 or 12A is further improved.

The method of flattening the surfaces 2b and 12b of the bonding layers 2, 2A, 12 and 12A, and the surfaces 4a and 1a of the piezoelectric single crystal substrate 4 and supporting substrate 1 includes lapping, chemical mechanical polishing (CMP) or the like.

According to a preferred embodiment, the surface 2b of the bonding layer 2 or 2A and the surface 4a or 1a of the piezoelectric single crystal substrate 4 or supporting substrate 1 can be activated by a neutralized beam. Particularly, when the surface 2b or 12b of the bonding layer 2, 2A, 12 or 12A, the surface 4a of the piezoelectric single crystal substrate 4, or the surface 1a of the supporting substrate 1 is a flat surface, the direct bonding can be easily performed.

When the activation of the surfaces is performed using the neutralized beam, it is preferred to use a system described in patent document 3 to generate the neutralized beam which is irradiated. That is, a high-speed atomic beam source of saddle field type is used as the beam source. Then, an inert gas is introduced into the chamber and a high voltage is applied onto electrodes from a direct current electric source. As a result, the electric field of a saddle field type generated between the electrode (positive electrode) and a housing (negative electrode) causes motion of the electrons, e, so that atomic and ion beams derived from the inert gas are generated. Among the beams that reach the grid, the ion beam is neutralized at the grid, and a beam of neutral atoms is emitted from the high-speed atomic beam source. Atomic species forming the beam may preferably be an inert gas (argon, nitrogen or the like).

In the activation step by beam irradiation, the voltage may preferably be 0.5 to 2.0 kV, and the current may preferably be 50 to 200 mA.

Then, the activated surfaces are contacted and bonded with each other under a vacuum atmosphere. The temperature at this time may be an ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

The application of each of the bonded bodies 5, 5A, 15 and 15A of the present invention is not particularly limited, and it may preferably be applied as an acoustic wave device or an optical device.

As the acoustic wave devices 7 and 17, a surface acoustic wave device, Lamb wave-type device, thin film resonator (FBAR) or the like is known. For example, the surface acoustic wave device is produced by providing input side IDT (Interdigital Transducer) electrodes (also referred to as comb electrodes or interdigitated electrodes) for oscillating a surface acoustic wave and IDT electrodes on the output side for receiving the surface acoustic wave on the surface of the piezoelectric single crystal substrate. By applying a high frequency signal on the IDT electrodes on the input side, an electric field is generated between the electrodes, so that the surface acoustic wave is oscillated and propagated on the piezoelectric single crystal substrate. Then, the propagated surface acoustic wave is drawn as an electrical signal from the IDT electrodes on the output side provided in the direction of the propagation.

A metal film may be provided on a bottom surface of the piezoelectric single crystal substrate or 4A. After a Lamb type device is produced as the acoustic wave device, the metal film plays a role of improving the electro-mechanical coupling factor near the bottom surface of the piezoelectric substrate. In this case, the Lamb type device has the structure that interdigitated electrodes are formed on the surface 4b or 4c of the piezoelectric single crystal substrate 4 or 4A and that the metal film on the piezoelectric single crystal substrate 4 or 4A is exposed through a cavity provided in the supporting body 1. The materials of such metal films include aluminum, an aluminum alloy, copper, gold or the like, for example. Further, in the case that the Lamb type wave device is produced, a composite substrate having the piezoelectric single crystal substrate 4 or 4A without the metal film on the bottom surface may be used.

Further, a metal film and an insulating film may be provided on the bottom surface of the piezoelectric single crystal substrate 4 or 4A. The metal film plays a role of electrodes when a thin film resonator is produced as the acoustic wave device. In this case, the thin film resonator has the structure that electrodes are formed on the upper and bottom surfaces of the piezoelectric single crystal substrate 4 or 4A and the insulating film is made a cavity to expose the metal film on the piezoelectric single crystal substrate. The materials of such metal films include molybdenum, ruthenium, tungsten, chromium, aluminum or the like, for example. Further, the materials of the insulating films include silicon dioxide, phosphorus silicate glass, boron phosphorus silicate glass or the like.

Further, as the optical device, it may be listed an optical switching device, a wavelength conversion device and an optical modulating device. Further, a periodic domain inversion structure may be formed in the piezoelectric single crystal substrate 4 or 4A.

When the present invention is applied to the optical device, the size of the optical device can be reduced. Further, particularly in the case that a periodic domain inversion structure is formed, it is possible to prevent the deterioration of the periodic domain inversion structure by heat treatment. Further, the materials of the bonding layers 2, 2A, 12 and 12A of the present invention are of high insulation, the generation of domain inversion is prevented during the processing by the neutralized beam before the bonding, and the shape of the periodic domain inversion structure formed in the piezoelectric single crystal substrate 4 or 4A is hardly disordered.

Examples (Experiment A)

The bonded bodies 5 and 5A and acoustic wave device 7 of the respective examples shown in Table 1 were produced according to the method described referring to FIGS. 1 to 3.

Specifically, a lithium tantalate substrate (LT substrate) having an OF part, a diameter of 4 inches, and a thickness of 250 μm as the piezoelectric single crystal substrate 4, was used. A 46° Y-cut X-propagation LT substrate in which the propagation direction of surface acoustic wave (SAW) is X and the cutting angle is of rotated Y-cut plate was used. The surface 4a of the piezoelectric single crystal substrate 4 was subjected to a mirror surface polishing so that the arithmetic average roughness Ra reached 0.3 nm. Further, Ra is measured by an atomic force microscope (AFM) in a visual field of 10 μm x 10 μm.

Then, the bonding layer 2 was film-formed on the surface 4a of the piezoelectric single crystal substrate 4 by a direct current sputtering method. Si doped with boron was used as a target. Further, oxygen gas was introduced as an oxygen source. At this time, the amount of the introduced oxygen gas was changed to change the total pressure of the atmosphere and the partial pressure of oxygen in a chamber, so that the oxygen ratio (x) in the bonding layer 2 is changed. The thickness of the bonding layer 2 was made 100 to 200 nm. The arithmetic average roughness Ra of the surface 2a of the bonding layer 2 was 0.2 to 0.6 nm. Then, the bonding layer 2 was subjected to chemical mechanical polishing (CMP) so that the film thickness was made 80 to 190 μm and Ra was made 0.08 to 0.4 nm.

Further, as the supporting substrate 1, the supporting substrate 1 composed of Si and having the orientation flat (OF) part, a diameter of 4 inches, and a thickness of 500 μm was prepared. The surfaces 1a and 1b of the supporting substrate 1 were finished by chemical mechanical polishing (CMP) so that the respective arithmetic average roughnesses Ra reached 0.2 nm.

Then, the flat surface 2b of the bonding layer 2A and surface 1a of the supporting substrate 1 were cleaned to remove the contamination, followed by introduction into a vacuum chamber. After it was evacuated to the order of $10^{-6}$ Pa, a high-speed atomic beam (at an acceleration voltage of 1 kV and Ar flow rate of 27 sccm) was irradiated onto the bonding surfaces 1a and 2b of the respective substrates, for 120 seconds. Then, after the beam-irradiated surface (activated surface) 2b of the bonding layer 2A and the activated surface 1a of the supporting substrate 1 were contacted with each other, the substrates 1 and 4 were bonded by pressurizing at 10000N for 2 minutes (refer to FIG. 2(a)). Then, the bonded bodies 5 of the respective examples obtained were heated at 100° C. for 20 hours.

Then, the bonded body 5A (refer to FIG. 2(b)) was obtained by subjecting the surface 4b of the piezoelectric single crystal substrate 4 to grinding and polishing so that the thickness was changed from the initial 250 μm to 1 μm.

The following characteristics were evaluated for the bonded bodies 5A and acoustic wave devices 7 obtained.
(Oxygen Ratio (x) in Bonding Layer 2A)

The bonding layer 2A was evaluated according to the following conditions by Rutherford Backscattering Spectrometry.

At this time, the measured values of the oxygen ratios xB and xA at the respective end parts are measured values each in a range of a thickness of 5 nm from each of the respective interfaces.

Further, the central part of the bonding layer 2A means the center of the whole film thickness of the bonding layer 2A measured by the film thickness meter as described above (in other words, the position at which a distance between the interface A and the central part of the bonding layer 2A is substantially same as a distance between the interface B and the central part of the bonding layer 2B).

(Bonding Strength)

The bonding strengths of the bonded bodies 5A of the respective examples were measured by a crack opening method.

(Q Value)

The acoustic wave device 7 was then produced and the Q value was measured.

Specifically, the IDT electrodes 6 for generating the surface acoustic wave were formed through a photolithography step. The electrodes 6 were formed, followed by dicing into small pieces to obtain acoustic wave device chips each having sizes of 5 mm in the direction of propagation and 4 mm in the vertical direction.

The measurement results were shown in Table 1.

TABLE 1

| | Material of | Oxygen ratio (x) of Si(1 − x)Ox of bonding layer 2A | | | Material of | Interface | Bonding | |
| | Piezoelectric Material substrate 4 | End part on the side of piezoelectric single crystal substrate 4A | Central part | End part On the side of supporting substrate 1 | Supporting Substrate 1 | Formed by Direct bonding | Strength (J/m2) | Q value |
|---|---|---|---|---|---|---|---|---|
| Inventive Example 1 | LT | 0.001 | 0.013 | 0.001 | Si | Si(1 − x)Ox//Si | 1.5 | 1700 |
| Comparative Example 1 | LT | 0.007 | 0.007 | 0.007 | Si | Si(1 − x)Ox//Si | 1.5 | 1200 |
| Comparative Example 2 | LT | 0.001 | 0.009 | 0.001 | Si | Si(1 − x)Ox//Si | 1.5 | 1100 |

System: supplied by National Electrostatics Corporation, "Pelletron 3SDH"
Conditions:
Incident ion: 4He$^{++}$
Incident energy: 2300 keV
Incident angle: 0 to 4 deg
Scattering angle: 110 deg
Sample current: 10 nA
Beam size: 2 mmφ
In-plane rotation: None
Amount of irradiation: 70 μC The results were analyzed to obtain the distribution of elements in the depth direction of the bonding layer 2A. The following parameters were used for the analysis.

Film thickness of bonding layer 2A:

Value measured by an optical non-contact film thickness meter (NANOMETRICS incorporated, nano-spec film thickness measurement apparatus, model 5000)

Atomic number density of lithium tantalate: $9.52 \times 10^{22}$ atoms/cm$^3$

The measured value of the film thickness of the bonding layer 2A obtained as described above and distribution of elements (including distribution of oxygen ratios) in the direction of depth (thickness) of the bonding layer 2A were compared with each other, so that the oxygen ratio xB at the end part of the bonding layer 2A on the side of the piezoelectric single crystal substrate 4A, the oxygen ratio xO at the central part of the bonding layer 2A, and the oxygen ratio xA of the bonding layer 2A on the side of the supporting substrate 1 were read.

When the inventive example 1 and comparative examples 1 and 2 were compared with each other, in the inventive example 1, the requirements of the present invention were satisfied and the bonding strength and Q value were high (Q value: 1700). On the other hand, in the comparative example 1, the oxygen ratio x was constant in the bonding layer 2A. Therefore, although the average value of the oxygen ratio in the whole of the bonding layer 2A was comparable with that in the inventive example 1, the Q value was considerably reduced (Q value: 1200). In the comparative example 2, although the oxygen ratio xO at the central part of the bonding layer 2A is higher than the oxygen ratio xA at the end part of the bonding layer 2A on the side of the supporting substrate 1 and the oxygen ratio xB at the end part of the bonding layer 2A on the side of the piezoelectric single crystal substrate 4A, the oxygen ratio xO was as low as 0.009 so that the Q value was considerably lowered (Q value: 1100).

(Experiment B)

The bonded body 5A and acoustic wave device 7 were produced according to a procedure similar to that of the Experiment A. However, the oxygen ratio x in the bonding layer 5A was changed as shown in Table 2 in the Experiment A. The bonding strengths and Q values of the bonded bodies 5A and acoustic wave devices 7 obtained were measured according to the same procedure as the Experiment A, and the results were shown in Table 2.

TABLE 2

| Material of Piezoelectric Material substrate 4 | Oxygen ratio (x) of Si(1 − x)Ox of bonding layer 2A | | | Material of Supporting Substrate 1 | Interface Formed by Direct bonding | Bonding Strength (J/m2) | Q value |
|---|---|---|---|---|---|---|---|
| | End part on the side of piezoelectric single crystal substrate 4A | Central part | End part On the side of supporting substrate 1 | | | | |
| Inventive Example 2 | LT | 0.001 | 0.666 | 0.001 | Si | Si(1 − x)Ox//Si | 1.5 | 2000 |
| Inventive Example 3 | LT | 0.408 | 0.666 | 0.408 | Si | Si(1 − x)Ox//Si | 1.5 | 2000 |
| Comparative Example 3 | LT | 0.001 | 0.001 | 0.001 | Si | Si(1 − x)Ox//Si | 1.5 | 1000 |
| Comparative Example 4 | LT | 0.333 | 0.333 | 0.333 | Si | Si(1 − x)Ox//Si | 1.5 | 1900 |
| Comparative Example 5 | LT | 0.666 | 0.666 | 0.666 | Si | Si(1 − x)Ox//Si | 0.3 | — |

When inventive examples 2 and 3 and comparative examples 3 to 5 were compared with each other, in inventive examples 2 and 3, high bonding strengths and Q values were obtained (both of Q values: 2000). Contrary to this, in the comparative example 3, since the oxygen ratio x was constant in the bonding layer 2A and the oxygen ratio x in the bonding layer 2A was as low as 0.001, the Q value was proved to be low (Q value: 1000) Further, in the comparative example 5, since the oxygen ratio x was constant in the bonding layer 2A and the oxygen ratio x in the bonding layer 2A was as high as 0.666, the bonding strength was low so that the acoustic wave device could not be produced. In the comparative example 4, since the oxygen ratio x was constant in the bonding layer 2A and 0.333, the Q value was inferior compared to those of the inventive examples 2 and 3 (Q value: 1900).

(Experiment C)

The bonded body 5A and acoustic wave device 7 were produced according to the same procedure as that of Experiment A. However, in the inventive example 2 of Experiment B, the material of the supporting substrate 1 was changed as shown in Table 3. That is, the material of the supporting substrate 1 was changed to sapphire in the inventive example 4, mullite in the inventive example 5, cordierite in the inventive example 6, translucent alumina sintered body in the inventive example 7, and sialon in the inventive example 8. The bonding strengths and Q values of the bonded bodies 5A and acoustic wave devices 7 obtained were measured according to the same procedure as that of the Experiment A, and the results were shown in Table 3.

In the inventive examples 4 to 8, although the material of the supporting substrate 1 was changed to sapphire or various kinds of the ceramic materials, it was confirmed that high bonding strengths and Q values were obtained (Q value: 2200 in the inventive example 4, Q value: 2500 in the inventive example 5, Q value: 2500 in the inventive example 6, Q value: 2300 in the inventive example 7, and Q value: 2500 in the inventive example 8).

Further, although the inventive example 1 to 8 are described referring to the bonded bodies 5A and acoustic wave device 7, similar results were obtained in the examples of the bonded bodies 15A and acoustic wave devices 17.

The invention claimed is:

1. A bonded body comprising:
    a supporting substrate comprising a polycrystalline ceramic material or a monocrystalline material;
    a piezoelectric single crystal substrate; and
    a bonding layer provided between said supporting substrate and said piezoelectric single crystal substrate,
    wherein
    said bonding layer has a composition of $Si_{(1-x)}O_x$, x indicating an oxygen ratio,
    the oxygen ratio x at a central part in a thickness direction of said bonding layer is higher than the oxygen ratio x at an end part of said bonding layer on a side of said piezoelectric single crystal substrate and the oxygen ratio x at an end part of said bonding layer on a side of said supporting substrate, and

TABLE 3

| Material of Piezoelectric Material substrate 4 | Oxygen ratio (x) of Si(1 − x)Ox of bonding layer 2A | | | Material of Supporting Substrate 1 | Interface Formed by Direct bonding | Bonding Strength (J/m2) | Q value |
|---|---|---|---|---|---|---|---|
| | End part on the side of piezoelectric single crystal substrate 4A | Central part | End part On the side of supporting substrate 1 | | | | |
| Inventive Example 4 | LT | 0.001 | 0.666 | 0.001 | Sapphire | Si(1 − x)Ox// Sapphire | 1.5 | 2200 |
| Inventive Example 5 | LT | 0.001 | 0.666 | 0.001 | Mullite | Si(1 − x)Ox// Mullite | 1.5 | 2500 |
| Inventive Example 6 | LT | 0.001 | 0.666 | 0.001 | Cordierite | Si(1 − x)Ox// Cordierite | 1.5 | 2500 |
| Inventive Example 7 | LT | 0.001 | 0.666 | 0.001 | Translucent Alumina | Si(1 − x)Ox// Translucent Alumina | 1.5 | 2300 |
| Inventive Example 8 | LT | 0.001 | 0.666 | 0.001 | Sialon | Si(1 − x)Ox// Sialon | 1.5 | 2500 | the oxygen ratio x at said central part in the thickness direction of said bonding layer is 0.013 or higher and 0.666 or lower.

2. The bonded body of claim 1, wherein an interface of said supporting substrate and said bonding layer is an interface formed by direct bonding, and said oxygen ratio x at said end part of said bonding layer on the side of said supporting substrate is 0.001 or higher and 0.408 or lower.

3. The bonded body of claim 1, wherein an interface between said piezoelectric single crystal substrate and said bonding layer is an interface formed by direct bonding, and said oxygen ratio x at said end part of said bonding layer on the side of said piezoelectric single crystal substrate is 0.001 or higher and 0.408 or lower.

4. The bonded body of claim 1, wherein said supporting substrate comprises a material selected from the group consisting of silicon, sapphire, mullite, cordierite, translucent alumina and sialon.

5. The bonded body of claim 1, wherein said piezoelectric single crystal substrate comprises lithium niobate, lithium tantalate or lithium niobate-lithium tantalate solid solution.

6. An acoustic wave device comprising:

said bonded body of claim 1; and an electrode provided on said piezoelectric single crystal substrate.

* * * * *